United States Patent
Kim et al.

(10) Patent No.: US 6,436,303 B1
(45) Date of Patent: Aug. 20, 2002

(54) FILM REMOVAL EMPLOYING A REMOTE PLASMA SOURCE

(75) Inventors: Bok Heon Kim; Nam Le, both of San Jose; Joseph V. D'Souza, Sunnyvale; Ashish Shrotriya, Santa Clara, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/359,148

(22) Filed: Jul. 21, 1999

(51) Int. Cl.[7] ............................................. H01L 21/00
(52) U.S. Cl. ........................ 216/67; 134/1.1; 134/1.2; 438/710; 438/727; 438/731
(58) Field of Search .................... 134/1.1, 1.2; 438/710, 438/727, 730, 731, 906, 935, 963; 216/67

(56) References Cited

U.S. PATENT DOCUMENTS

| | | | |
|---|---|---|---|
| 4,875,989 A | 10/1989 | Davis et al. | 204/298 |
| 4,899,195 A | 2/1990 | Gotoh | 355/77 |
| 5,094,885 A | 3/1992 | Selbrede | 427/248.1 |
| 5,133,284 A | 7/1992 | Thomas et al. | 118/719 |
| 5,213,650 A | 5/1993 | Wang et al. | 156/345 |
| 5,238,499 A | 8/1993 | van de Ven et al. | 118/724 |
| 5,456,757 A | * 10/1995 | Aruga et al. | 118/723 E |
| 5,578,532 A | 11/1996 | van de Ven et al. | 437/245 |
| 5,620,525 A | 4/1997 | van de Ven et al. | 118/728 |
| 5,658,417 A | 8/1997 | Watanabe et al. | 156/345 |
| 5,662,770 A | * 9/1997 | Donohoe | 438/716 |
| 5,693,147 A | 12/1997 | Ward et al. | 134/1.1 |
| 6,004,631 A | * 12/1999 | Mori | 427/534 |
| 6,184,154 B1 | * 2/2001 | Dietze et al. | 438/762 |

FOREIGN PATENT DOCUMENTS

| | | | |
|---|---|---|---|
| EP | 0 741 406 A2 | 11/1996 | H01L/21/3065 |
| JP | 08-279494 | 11/1995 | H01L/21/3065 |
| JP | 08-330402 | 12/1996 | H01L/21/68 |

OTHER PUBLICATIONS

Seok–Min Yun et al., "Low Dielectric Constant CF/SiOF Composite Film Deposition in a Helicon Plasma Reactor," *Thin Solid Films*, vol. 341, No. 1–2, pp. 109–111 (Mar. 1999).

P.M. Frijlink et al., "Layer Uniformity in a Multiwater MOVPE Reactor for III–V Compounds," *Journal of Crystal Growth*, NL, North–Holland, vol. 107, No. 1/04, pp. 166–174 (Jan. 1991).

* cited by examiner

Primary Examiner—Randy Gulakowski
Assistant Examiner—Allan Olsen
(74) Attorney, Agent, or Firm—Townsend & Townsend & Crew

(57) ABSTRACT

A method and device for removing film from a substrate are provided that take advantage of a remote plasma source to etch away undesired portions of films, such as dielectric films formed on a substrate. To that end, the method includes forming a plasma remotely with respect to the process chamber, from which a flow is created that is directed toward the substrate. The substrate is of a type having opposed major surfaces with a peripheral surface extending therebetween. A film, such as a dielectric film, is disposed on one of the opposed major surfaces and on the peripheral surface. The opposed major surface having the film thereon is shielded from the flow of reactive radicals while the peripheral surface is left exposed. In this fashion, the flow is maintained for a sufficient amount of time to remove film present on the peripheral surface.

20 Claims, 8 Drawing Sheets

FILM REMOVAL EMPLOYING A REMOTE PLASMA SOURCE

BACKGROUND OF THE INVENTION

The present invention relates to substrate processing. Specifically, the present invention relates to a device and a method for etching away unwanted portions of film deposited upon a substrate that is less destructive to the substrate and takes substantially less time to perform than prior art etching techniques.

During the fabrication of modern semiconductor devices a backseal process may be employed to protect one side of the substrate from mechanical damage, such as scratching. One benefit of the backseal layer includes providing substrates with a more uniform dopant profile by preventing the dopants from migrating during growth of an epi-layer on an opposing surface. Typically, the backseal process deposits a dielectric film on a side of the substrate positioned opposite to the side upon which patterned features are to be formed.

As is well known, such a backseal layer can be deposited by a chemical vapor deposition (CVD) process. In a conventional thermal CVD process, reactive gases are supplied to the substrate surface where heat-induced chemical reactions take place to form the desired film over the surface of the substrate being processed. In a conventional plasma-enhanced CVD (PECVD) process, a controlled plasma is formed using radio frequency (RF) energy or microwave energy to decompose and/or energize reactive species in reactant gases to produce the desired film.

During deposition of the backseal layer, dielectric material deposits on the peripheral surface of the substrate, positioned between opposed major surfaces of the same. One common method of removing this portion of the backseal layer employs a wet-etch process, such as a bath of hydrofluoric vapor. In addition to being relatively time consuming, the wet-etch process has a tendency to damage the exposed surfaces of the substrate and remove portions of the backseal layer that should remain on the substrate.

Accordingly, improved processes to remove backseal layer from the peripheral surface of a substrate without damaging the substrate or removing the remaining portions of the backseal layer.

SUMMARY OF THE INVENTION

A method and a device for removing film from a substrate are provided that take advantage of a remote plasma source to etch away undesired portions of films, such as dielectric films, formed on a substrate. To that end, the method includes remotely forming a plasma with respect to a process chamber. The plasma includes a plurality of reactive radicals from which a flow is created that is directed toward the substrate disposed in the process chamber. The substrate is of the type having opposed major surfaces with a peripheral surface extending therebetween. A film, such as a dielectric film, is disposed on one of the opposed major surfaces, as well as a portion of the peripheral surface. The opposed major surface having the film thereon is shielded from the flow of reactive radicals while the peripheral surface is left exposed. In this fashion, the flow is maintained for a sufficient amount of time to remove film present on the peripheral surface. The device for removing film on a substrate comprises a process chamber having an intake region, a plasma source in electrical communication with an intake region, a pump system in fluid communication with both the plasma source and the process chamber; and a substrate support, having a recess formed therein defining a nadir surface and a side surface. The nadir surface is positioned opposite to an intake region of the recess chamber, and the side surface extends from, and transversely to, the nadir surface toward the intake region, terminating in an opening having an area. The area is substantially coextensive with the intake region.

These and other embodiments of the present invention along with many of its advantages and features are described in more detail in conjunction with the text below and attached figures.

DESCRIPTION OF THE SPECIFIC EMBODIMENTS

I. Exemplary CVD System

Figure 1A:
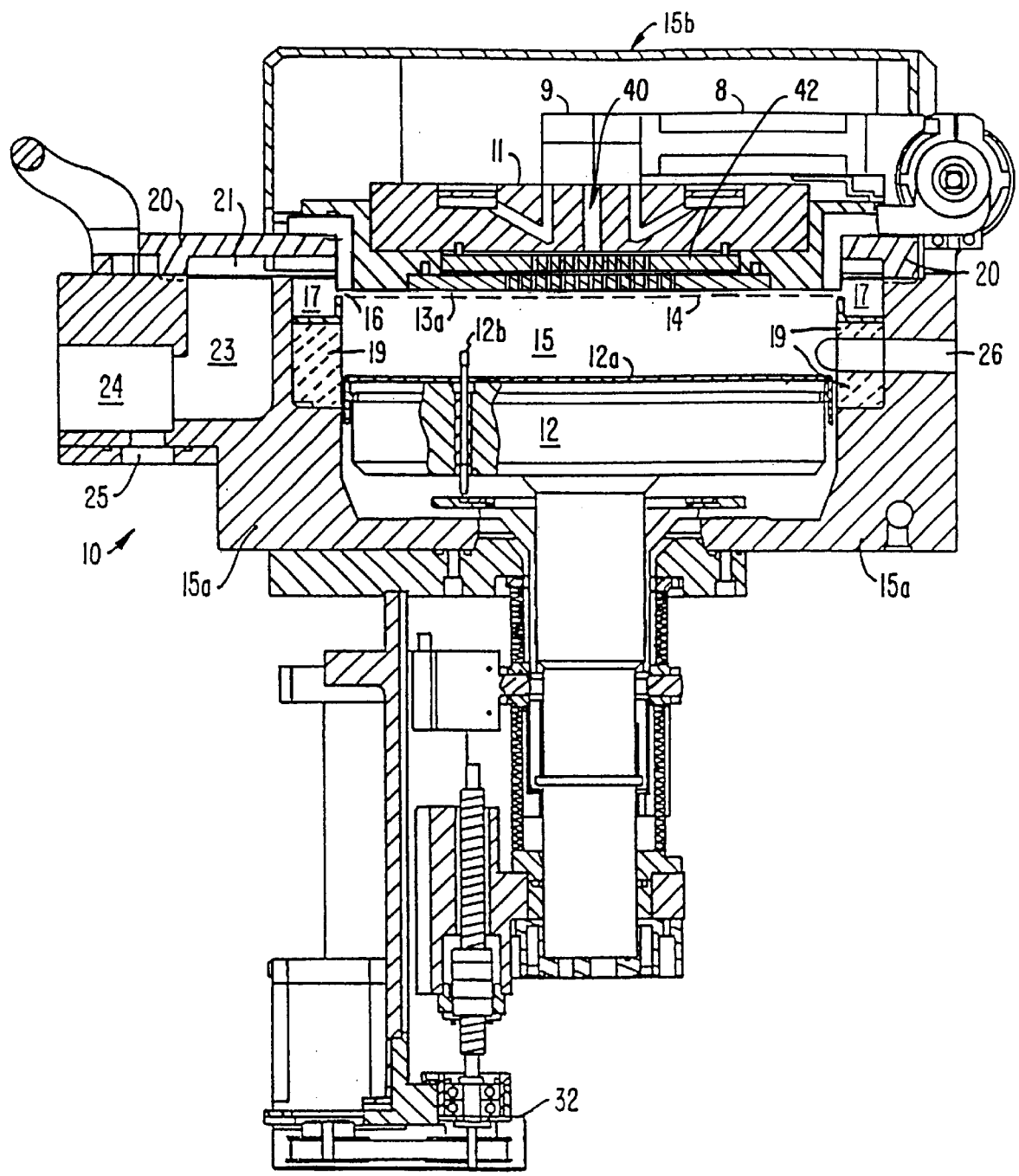
FIGS. 1A and 1B are vertical cross-sectional views of one embodiment of an exemplary substrate processing apparatus, such as a CVD apparatus, which may be used in accordance with the present invention.
Figure 1B:
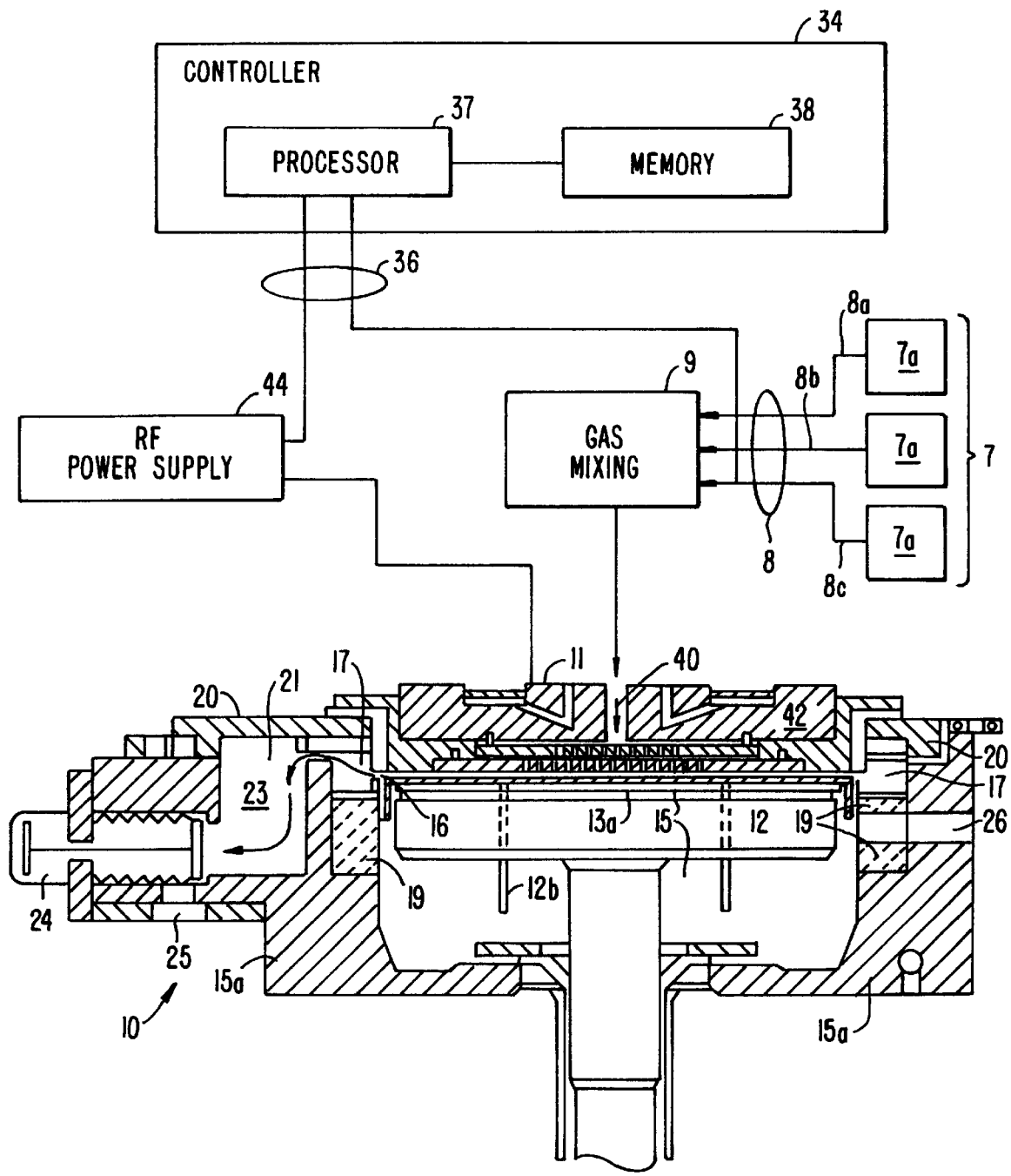

Specific embodiments of the present invention may be used with or retrofitted onto a variety of chemical vapor deposition (CVD) or other types of substrate processing apparatus. One suitable substrate processing apparatus with which the present invention can be used or retrofitted is shown in FIGS. 1A and 1B. A CVD system 10 has a vacuum chamber/process chamber 15 that includes a chamber wall 15a and chamber lid assembly 15b.

The CVD system 10 contains a gas distribution manifold 11 for dispersing process gases over a substrate (not shown) that rests on a resistively-heated pedestal 12 centered within the process chamber 15. During processing, the substrate is positioned on a surface 12a of the pedestal 12. Preferably having a surface of ceramic such as aluminum nitride, the pedestal 12 can be moved controllably between a lower loading/off-loading position (depicted in FIG. 1A) and an upper processing position, indicated by broken line 14 adjacent to manifold 11. A centerboard (not shown) includes sensors for providing information on the position of the pedestal 12.

Figure 1C:
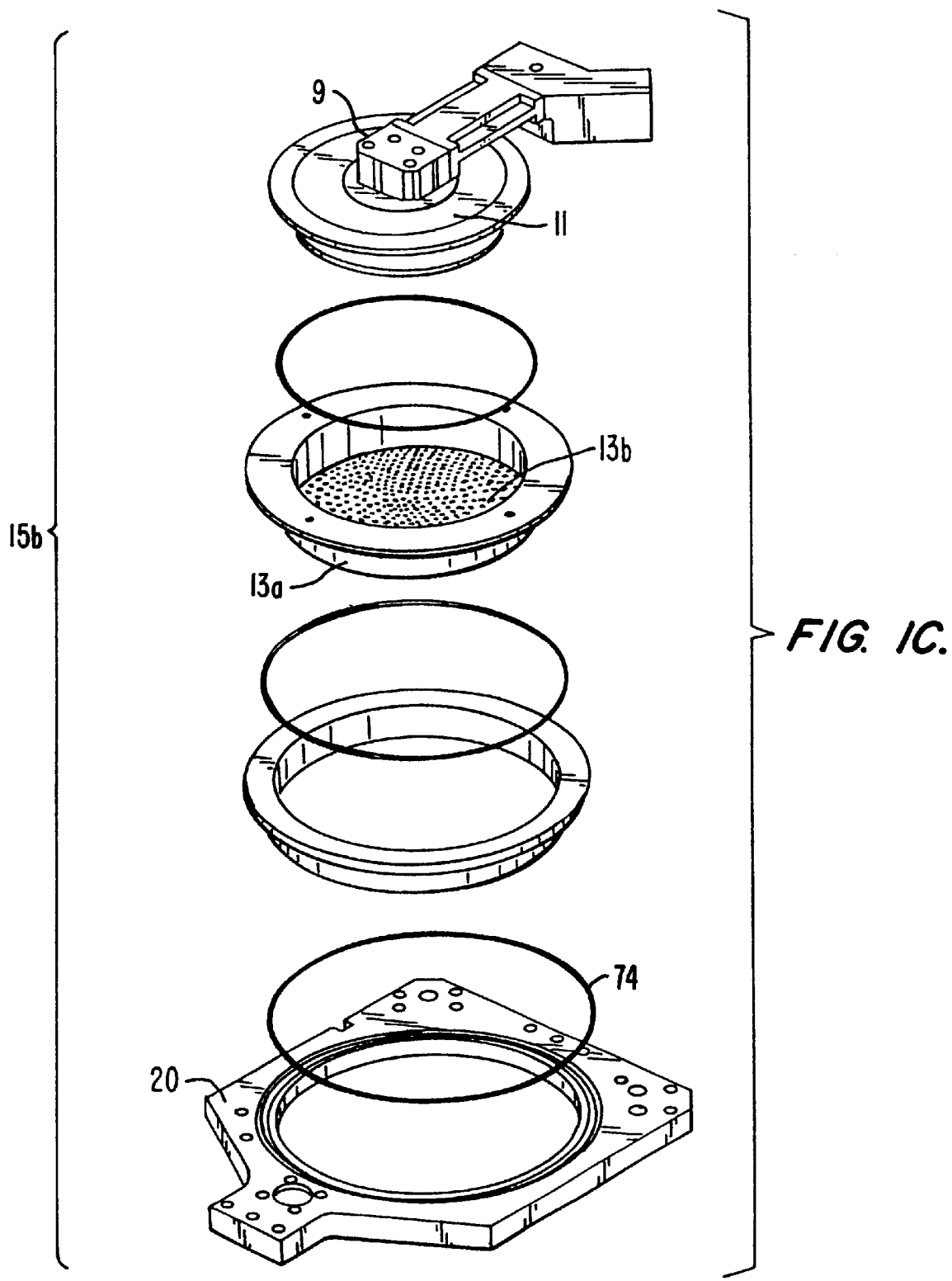
FIG. 1C is an exploded perspective view of parts of a CVD chamber depicted in FIG. 1A.

Referring to FIGS. 1A, 1B, and 1C, deposition and carrier gases are introduced into the process chamber 15 through an intake region defined by the perforated holes 13b of a gas distribution face plate 13a. More specifically, deposition process gases flow, as indicated by arrow 40, into the chamber through the manifold 11, a conventional perforated blocker plate 42, and then holes 13b in gas distribution faceplate 13a.

Referring to FIG. 1B, before reaching the manifold 11, deposition and carrier gases are input from gas sources 7 through gas supply lines 8 into a gas mixing block or system 9 where they are combined and then sent to manifold 11. It is also possible, and desirable in some instances, to direct deposition and carrier gases directly from supply lines 8 to manifold 11. In such a case, gas mixing system 9 is bypassed. In other situations, any of gas lines 8 may bypass gas mixing system 9 and introduce gases through passages (not shown) in the bottom of the process chamber 15. In the exemplary embodiment shown, there are three gas supply lines 8 to facilitate deposition of a tungsten silicide film $WSi_x$. A first line 8a supplies a silicon-containing gas, e.g., dichlorosilane, $SiH_2Cl_2$, referred to as "DCS" from a DCS source, e.g., from gas source 7a, into gas mixing system 9. A second line 8b supplies a tungsten-containing gas, e.g., tungsten hexafluoride, $WF_6$, from a $WF_6$ source, e.g., from gas source 7b into gas mixing system 9. For each line 8a and 8b, a carrier gas, e.g., argon from argon sources in gas sources 7a and 7b, can be supplied with the deposition gas to stabilize gas flows as appropriate. Such mixing of gases DCS and $WF_6$ upstream of chamber 15 is believed to result in more uniform gas distribution into the process chamber 15, thereby resulting in greater uniformity in the deposited $WSi_x$ film. A third supply line 8c introduces an inert purge gas, e.g., argon, from a gas source 7c. The argon gas may be introduced into the bottom of the chamber to keep deposition gases away from the area of the process chamber 15 below heater 12. In some preferred embodiments, an additional silicon source, e.g., silane, $SiH_4$, from source 7a may be supplied to gas line 8a.

Generally, the supply line for each process gas includes several safety shut-off valves (not shown) that can be used to automatically or manually terminate the flow of deposition gas into the chamber, as well as mass flow controllers MFCs (also not shown) to measure the flow of gas through one of the supply lines 8a, 8b and 8c. When toxic gases are used, the several safety shut-off valves are positioned on each gas supply line in conventional configurations.

The deposition process performed in the CVD system can be either a thermal process or a plasma-enhanced process. In a plasma-enhanced process, an RF power supply 44 applies electrical power between the gas distribution faceplate 13a and the pedestal 12 to excite the deposition gas mixture to form a plasma within a region between the faceplate 13a and pedestal 12, referred to herein as the "reaction region". The reaction region is positioned proximate to the surface of the semiconductor wafer supported on pedestal 12. RF power supply 44 can be a mixed frequency RF power supply that typically supplies power at a high RF frequency ($RF_1$) of 13.56 Megahertz (MHz) and at a low RF frequency ($RF_2$) of 360 kilohertz (kHz) to enhance the decomposition of molecules in the deposition gas that form reactive species of atoms introduced into the process chamber 15. Of course, RF power supply 44 can supply either single-frequency or mixed-frequency RF power, or other desired frequency variations to manifold 11 to enhance the decomposition of gas molecules introduced into the process chamber 15. In a thermal process, RF power supply 44 need not be utilized, and the deposition gas mixture thermally reacts to deposit the desired film on the surface of the semiconductor wafer supported on pedestal 12. The pedestal is resistively heated to provide the thermal energy needed for the reaction.

During a plasma-enhanced deposition process, the plasma heats the entire CVD system 10, including the walls 15a of the chamber body surrounding the exhaust passageway 23 and the shut-off valve 24. During a thermal deposition process, heated pedestal 12 heats the CVD system 10. When the plasma is not activated, e.g., during a thermal deposition process, a hot liquid is circulated through the chamber walls 15a of the CVD system 10 to maintain the process chamber 15 at an elevated temperature. Fluids used to heat the chamber walls 15a include the typical fluid types, i.e., water-based ethylene glycol or oil-based thermal transfer fluids. This heating beneficially reduces or eliminates condensation of undesirable reactant products and improves the elimination of volatile products of the process gases and contaminants that might otherwise condense on the walls of cool vacuum passages and migrate back into the process chamber 15 during periods of no gas flow.

The portion of the gas mixture that is not deposited, including reaction products, is evacuated from the process chamber 15 by a vacuum pump (not shown). Specifically, the gases are exhausted through an annular, slot-shaped orifice 16 surrounding the reaction region into an annular exhaust plenum 17. The annular slot 16 and the plenum 17 are defined by the gap between the top of the chamber walls 15a, including the upper dielectric lining 19 on the wall, and the bottom of the chamber lid 20. The circular symmetry and uniformity of the slot orifice 16 and the plenum 17 facilitate a uniform flow of process gases over the reaction region, so as to deposit a uniform film on the substrate (not shown).

The gases flow underneath a lateral extension 21 of the exhaust plenum 17, past a viewing port (not shown), through a downwardly extending gas passage 23, past a vacuum shut-off valve 24 (whose body is integrated with the lower chamber wall 15a), and into an exhaust outlet 25 that connects to the external vacuum pump (not shown) through a foreline (also not shown).

The pedestal 12 may be heated using an embedded single-loop heater element configured to make two full turns in the form of parallel concentric circles. An outer portion of the heater element runs adjacent to a perimeter of the pedestal, while an inner portion runs on the path of a concentric circle having a smaller radius. The wiring to the heater element passes through the stem of pedestal 12.

Typically, any or all of the chamber lining, gas inlet manifold faceplate, and various other reactor hardware are made out of material such as aluminum, anodized aluminum, or ceramic. An example of such CVD apparatus is described in commonly assigned U.S. Pat. No. 5,558,717 entitled "CVD Process chamber," issued to Zhao et al., hereby incorporated by reference in its entirety.

Referring again to both FIGS. 1A and 1B, a lift mechanism and motor 32 (FIG. 1A) raises and lowers the pedestal 12 and its wafer lift pins 12b as wafers are transferred by a robot blade (not shown) into and out of the wall 15a of the process chamber 15 through an insertion/removal opening 26. The motor 32 raises and lowers the pedestal 12 between the processing position 14 and a lower substrate-loading position. The motor 32, valves or flow controllers (not shown) connected to the supply lines 8, gas delivery system, throttle valve, RF power supply 44, and chamber and substrate heating systems are all controlled by a system controller 34 over control lines 36, of which only some are shown. The system controller 34 relies on feedback from optical sensors to determine the position of movable mechanical assemblies such as the throttle valve and pedestal which are moved by appropriate motors controlled by controller 34.

In a preferred embodiment, the system controller 34 includes a memory 38, and a processor 37. The memory 38 may be any known in the art, including a removable or non-removable disk drive. The processor 37 contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD system 10. The system controller 34 executes system control software, which is a computer program stored in a computer-readable medium such as a memory 38. The computer program includes sets of instructions that dictate the timing, mixture of gases, chamber pressure, chamber temperature, RF power levels, pedestal position, and other parameters of a particular process.

The reactor description above is mainly for illustrative purposes, and other equipment such as electron cyclotron resonance (ECR) plasma CVD devices, induction coupled RF high density plasma CVD devices, or the like, may be used with the present invention to provide upgraded apparatus. Additionally, variations of the above-described system, such as variations in pedestal design, heater design, RF power frequencies, location of RF power connections and others are possible. For example, a substrate could be supported and heated by quartz lamps. It should be recognized that the present invention is not necessarily limited to use with, or retrofitting of, any specific apparatus.

II. Exemplary Structures

Figure 2A:
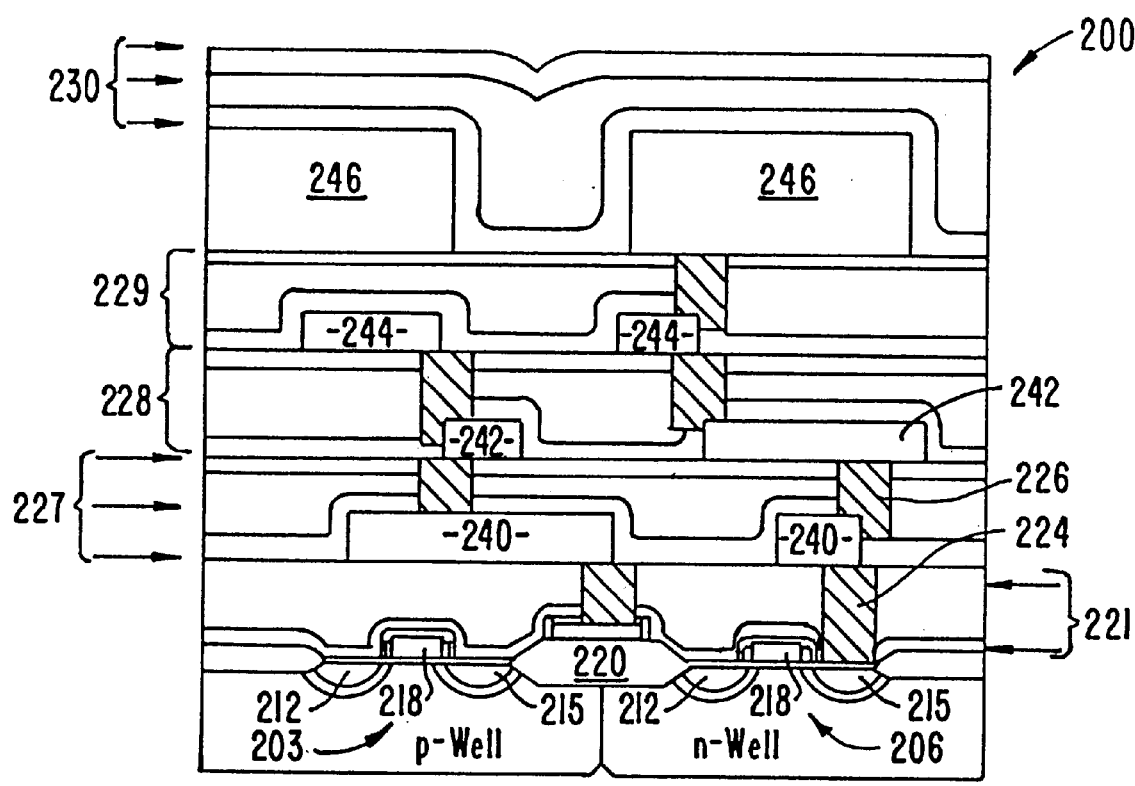
FIG. 2A is a simplified cross-sectional view of a semiconductor device manufactured in accordance with a specific embodiment of the present invention.

FIG. 2A illustrates a simplified cross-sectional view of an integrated circuit 200 which may be made in accordance with use of the present invention. As shown, integrated circuit 200 includes NMOS and PMOS transistors 203 and 206, which are separated and electrically isolated from each other by a field oxide region 220 formed by local oxidation of silicon (LOCOS), or another technique. Alternatively, transistors 203 and 206 may be separated and electrically isolated from each other by trench isolation (not shown) when transistors 203 and 206 are both NMOS or both PMOS. Each transistor 203 and 206 comprises a source region 212, a drain region 215 and a gate region 218.

A pre-metal dielectric (PMD) layer 221 separates transistors 203 and 206 from metal layer 240 with connections between metal layer 240 and the transistors made by contacts 219. Metal layer 240 is one of four metal layers, 240, 242, 244 and 246, included in integrated circuit 200. Each metal layer 240, 242, 244, and 246 is separated from adjacent metal layers by respective inter-metal dielectric (IMD) layers 227, 228, or 229. Adjacent metal layers are connected at selected openings by vias 226. Deposited over metal layer 246 are planarized passivation layers 230.

Figure 2D:
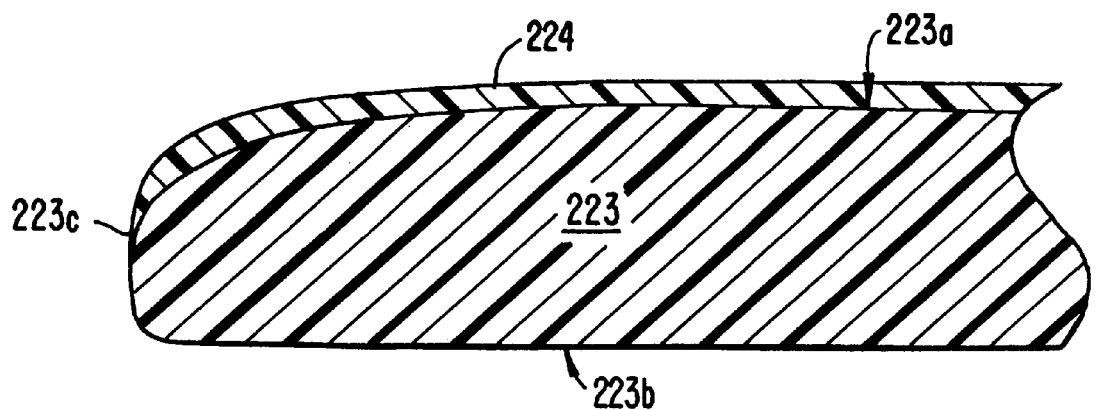
FIG. 2D is a side view of a substrate shown in FIGS. 2A–2C having a backseal layer positioned thereon.
Figure 2B:
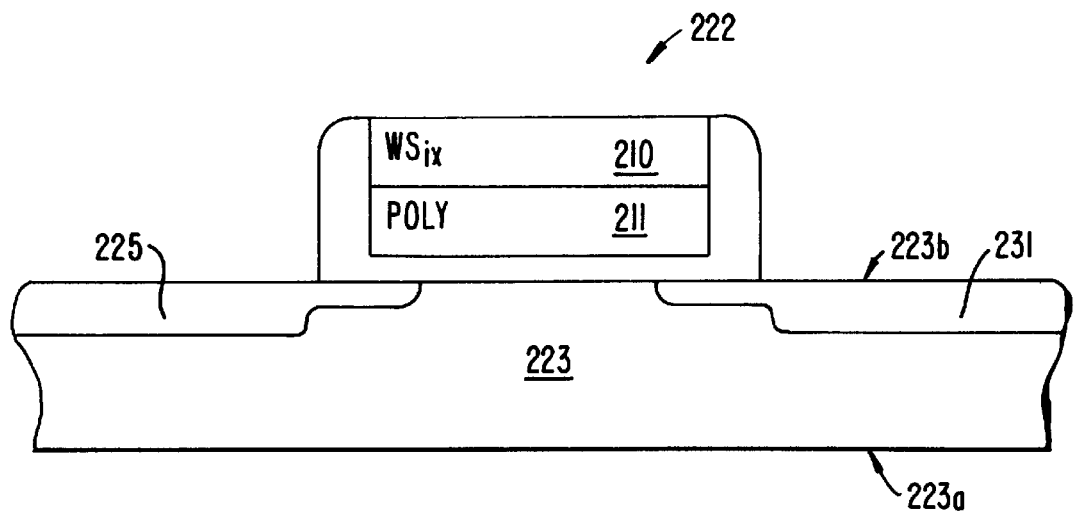
FIGS. 2B and 2C are simplified cross-sectional views of integrated circuit structures that incorporate WSiX layers in accordance with a specific embodiment of the present invention.
Figure 2C:
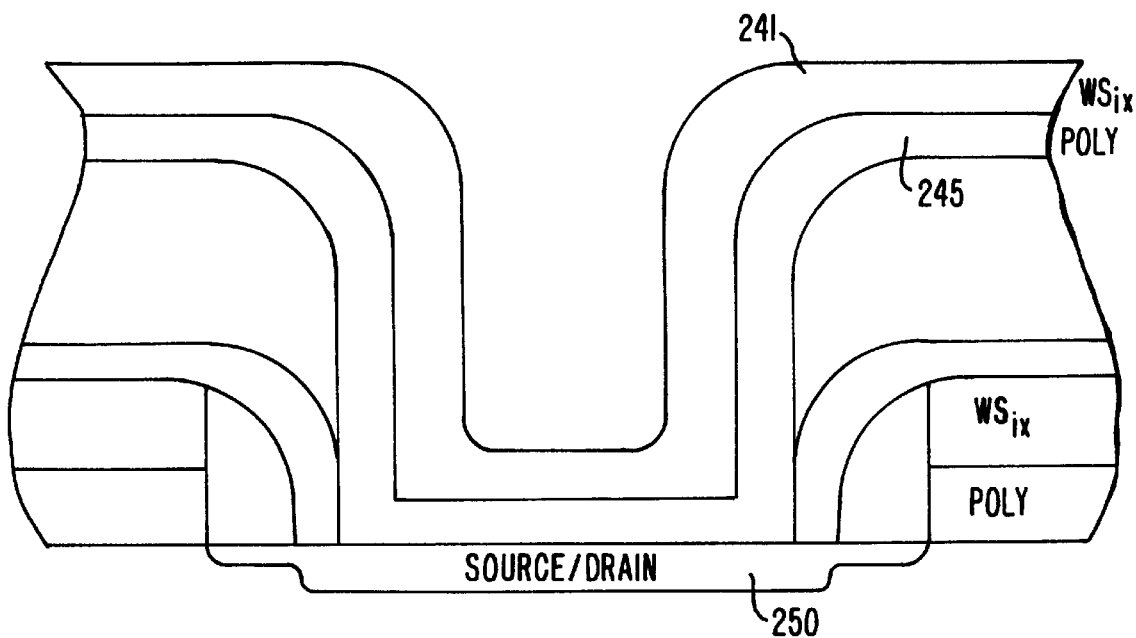

For gate metallizations in some applications, a low resistivity tungsten silicide (WSi$_x$) film is deposited on top of a layer of polycrystalline silicon (polysilicon), to form a layered structure called a "polycide" structure. Two examples of such polycide structures are shown in FIGS. 2B and 2C. As seen in FIG. 2B, a WSi$_x$ film 210 is deposited over a polysilicon film 211 to form a gate structure 222 that is part of a field effect transistor. The transistor is fabricated on a silicon substrate 223 and also includes source and drain regions 225 and 231. In FIG. 2C, a WSi$_x$ film 241 is deposited over a polysilicon layer 245 as part of a contact structure to source/drain region 250.

It should be understood that simplified integrated circuit 200 shown in FIG. 2A and structures shown in FIGS. 2B and 2C are for illustrative purposes only. One of ordinary skill in the art could implement use of the present invention in relation to fabrication of other integrated circuits such as microprocessors, application specific integrated circuits (ASICs), memory devices, and the like. Further, the present invention may be applied to fabrication of PMOS, NMOS, CMOS, bipolar, or BiCMOS devices.

III. Backseal Layer Formation

Before forming the exemplary structures, discussed above with respect to FIGS. 2A, 2B and 2C, it is useful to prepare the silicon substrate 223 by forming a dielectric film on the side 223a of the substrate positioned opposite the side 223b on which the exemplary structures are formed, defining a backseal layer. As shown in FIG. 2D, when depositing the backseal layer, shown as dielectric film 224, on one of the opposed major surfaces 223a and 223b, a portion of the film 224 is deposited on a peripheral surface 223c of the substrate 223. In this example, when the dielectric film 224 is deposited on surface 223a, a portion of the film is present on the peripheral surface 223c which extends between the opposed major surfaces 223a and 223b. The present invention employs a remote plasma source 300, shown in FIG. 3, in fluid communication with the process chamber 15.

Figure 3:
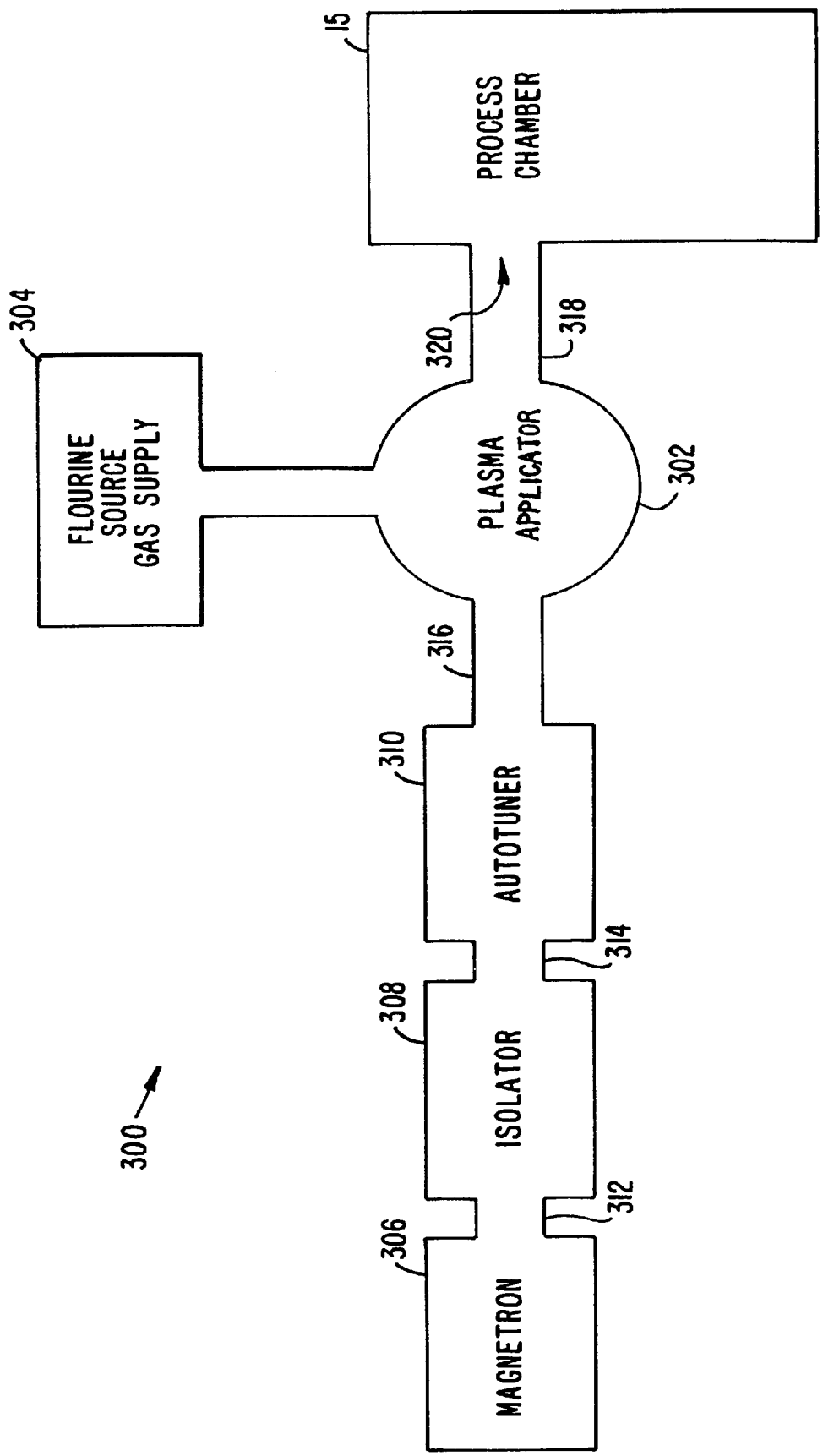
FIG. 3 is a simplified plan view of a remote microwave plasma source and process chamber in accordance with the present invention.

Referring to FIG. 3, an exemplary remote plasma source 300 includes a plasma applicator 302 in fluid communication with both a supply 304 of reactive gas and the process chamber 15. A microwave generator, such as a magnetron 306, is in electrical communication with the plasma applicator 302 via an isolator 308 and an autotuner 310. Specifically, a first waveguide 312 is coupled between the magnetron 306 and the isolator 308; a second waveguide 314 is coupled between the autotuner 310 and the isolator 308; and a third waveguide is coupled between the autotuner 310 and the applicator 302. The microwave energy generated by the magnetron travel toward the applicator 302 by traversing waveguides 312, 314 and 316. The autotuner 308 reduces the amount of microwave energy reflected into the magnetron 306. The autotuner 310 minimizes the microwave energy reflected by the applicator 302 back into the remaining components of the plasma source 300.

The reactive gas from supply 304 may include NF$_3$, F$_2$, diluted CF$_4$, C$_2$F$_6$, C$_3$F$_8$, SF$_6$, or ClF$_3$ among other gases and is flowed under vacuum from the substrate process chamber's pumping and exhaust system (not shown), into the plasma applicator 302 where microwave energy transmitted from the magnetron 306 form standing waves. The standing waves in applicator 302 ignite and maintain a plasma from the reactive gas, and a flow of reactive radicals, also under vacuum, is discharged from applicator 302 through output waveguide 318 and toward the process chamber 15 as a flow of reactive radicals.

Figure 4:
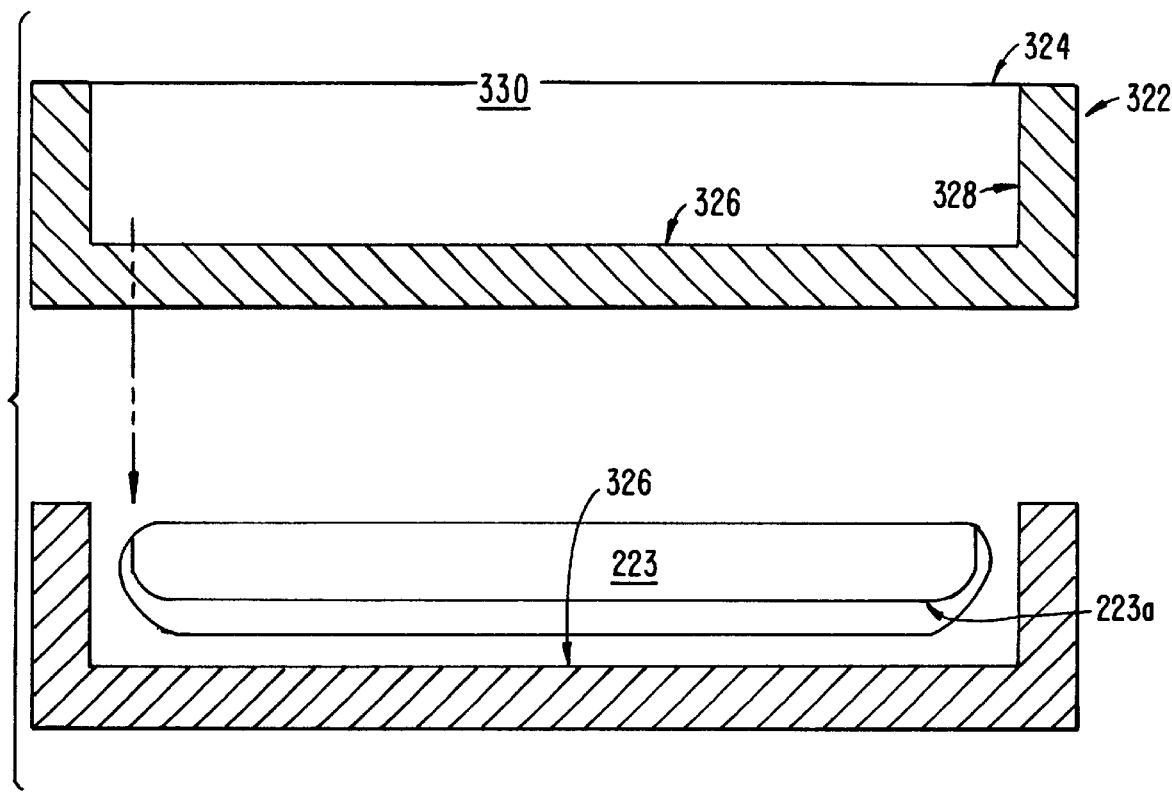
FIG. 4 is a side sectional view of an etch platform to be disposed on a pedestal, shown above in FIGS. 1A and 1B, in accordance with the present invention.
Figure 5:
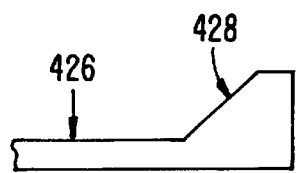
FIG. 5 is a partial side sectional view of the etch platform in accordance with an alternative embodiment of the present invention.

Referring to FIGS. 2D, 3 and 4, removal of the dielectric film from the peripheral a surface 223c is achieved by providing an etching platform 322 that includes an aluminum-nitride, AlN, body having a recess 324 formed therein defining a nadir 326 surface and a side surface 328. When disposed in the process chamber 15, the etching platform is positioned proximate to the pedestal 12, with the nadir surface 326 disposed opposite the gas distribution face plate 13a. The side surface 328 extends from the nadir surface 326, transversely thereto, toward the gas distribution face plate 13a, terminating in an opening 330. In one embodiment, the side surface 328 extends orthogonally from the nadir surface 326. In an alternative embodiment, shown in FIG. 5, the side surface 428 extends obliquely from the nadir surface 426.

Referring again to FIGS. 1A and 4, the opening 330 has an area which extends beneath the gas distribution face plate 13a. When disposed on the etch platform 322, the substrate 223 is received into the recess 324, with the peripheral surface 223c surrounded by the side surface 328 and spaced apart therefrom a predetermined distance. Preferably, the peripheral surface 223c is spaced apart from the side surface 328 a distance in the range of 5 to 30 mils, inclusive.

Figure 6:
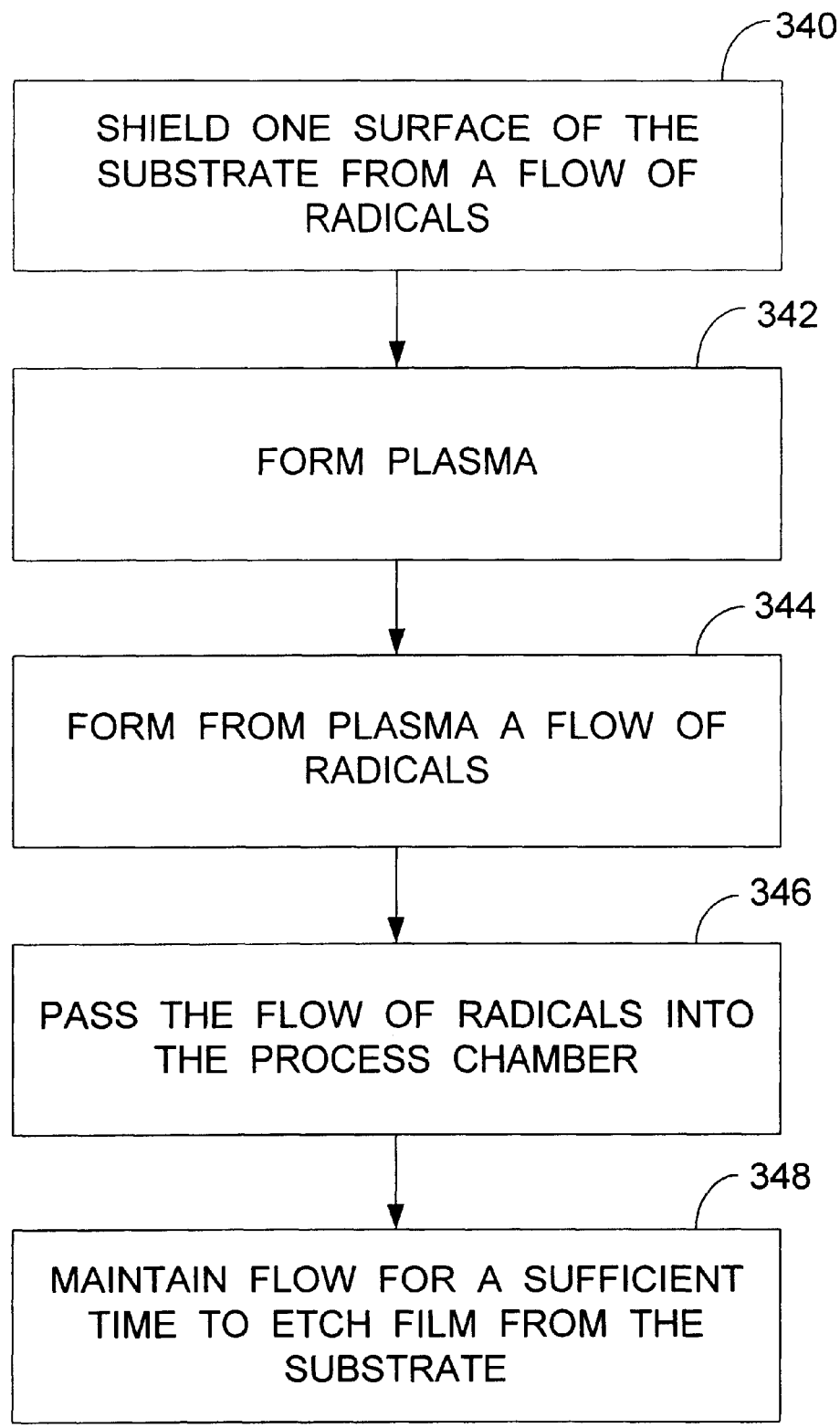
FIG. 6 is a flowchart illustrating the steps for performing a remote microwave plasma etch procedure in accordance with the present invention.

Referring to FIGS. 2D, 4 and 6, at step 340 the surface 223a is shielded from a flow of radicals formed from a plasma by placing the substrate in the etch platform 322 with the surface 223a facing the nadir surface 326 so that the peripheral surface 223c is spaced apart from the side surface 328, as discussed above. At step 342, a plasma is formed in the applicator 302 that includes a plurality of reactive radicals. The plasma has an RF component associated therewith having a power in the range of 1 to 3 kilowatts. Thereafter, at step 344, a flow is formed from the reactive radicals that moves towards the process chamber 15. At step 346 the flow of radicals enters into the chamber 15 through the gas distribution face plate 13a and onto the substrate. Preferably, the surface 223b is spaced apart from the gas distribution face plate 13 at a distance in the range of 300 to 600 mils, inclusive. At step 348, the flow of reactive radicals is maintained for a sufficient amount of time to remove film present on the peripheral surface 223c.

Referring to FIGS. 1A, 3 and 4, typically the flow rates of the reactive radicals into the process chamber 15 is dependent upon the size of the process chamber 15, as well as the temperature and pressure threin. In an exeplary embodiment, the chamber is pressurized in the range of 0.5 to 3 Torr, inclusive. The pedestal 12 is heated between 100° C. and 500° C. The faceplate 13a is heated between 50° C. and 200° C. and the chamber atmosphere is in the range of 50° to 500° C. At these temperatures, the flow rate of the reactive radicals, such as $NF_3$ is in the range of 500–3000 sccm.

It is to be understood that the above description is intended to be illustrative and not restrictive. Many embodiments will be apparent to those of skill in the art upon reviewing the above description. By way of example, the inventions herein have been illustrated primarily with regard to a cleaning apparatus, but they are not so limited. Those skilled in the art will recognize other equivalent or alternative methods of depositing or etching various layers while remaining in the scope of the claims of the present invention. The scope of the inventions should, therefore, be determined not with reference to the above description, but sho8uld instead be determined with reference to the appende claims, along with the full scope of equivalents to which such claims are entitled.

What is claimed is:

1. A method of removing film from a substrate of the type having first and second opposed major surfaces and a peripheral surface positioned therebetween, with said film being present on said first opposed major surface and said peripheral surface, with said substrate being disposed in a process chamber, said method comprising:

forming a plasma remotely with respect to said process chamber, said plasma including a plurality of reactive radicals;

providing inside said process chamber a body including a recess for receiving said substrate, said recess having a nadir surface and a side surface extending from said nadir surface to an opening of said recess;

positioning said substrate in said recess of said body with said entire first opposed major surface of said substrate contacting said nadir surface of said recess and with said peripheral surface spaced from said side surface of said recess;

forming a flow of said reactive radicals directed toward said substrate; and maintaining said flow for a sufficient amount of time to remove film present on said peripheral surface.

2. The method as recited in claim 1 wherein said step of forming a flow includes forming a flow of reactive radicals that extends transversely to said first and second opposed major surfaces.

3. The method as recited in claim 1 wherein said flow of reactive radicals is comprised of atoms associated with a reactive gas, with said reactive gas being selected from a group consisting of $NF_3$, $F_2$, diluted $CF_4$, $C_2F_6$, $C_3F_8$, $SF_6$, and $ClF_3$.

4. The method as recited in claim 1 wherein shielding said first surface from said flow includes positioning said substrate in the recess such that the peripheral surface is surrounded by said body and said body is spaced apart from said peripheral surface.

5. The method as recited in claim 4 wherein said body is formed from aluminum nitride.

6. The method as recited in claim 1 wherein said film is a dielectric film.

7. The method as recited in claim 1 wherein said process chamber is pressurized to a pressure in the range of 0.5 to 3.0 Torr, inclusive.

8. The method as recited in claim 1 wherein forming said plasma includes exciting a process gas with an RF component having a power in the range of 1 to 3 kilowatts.

9. The method as recited in claim 1 wherein the flow of said reactive radicals is directed toward said second opposed major surface of said substrate.

10. The method as recited in claim 1 wherein said peripheral surface of said substrate is spaced from said side surface of said recess by a distance of 5 to 30 mils, inclusive.

11. A method of removing film from a substrate of the type having first and second opposed major surfaces and a peripheral surface positioned therebetween, with said film being present on said first major opposed surface and said peripheral surface, with said substrate being disposed in a process chamber, said method comprising:

forming a plasma remotely with respect to said process chamber, said plasma including a plurality of reactive radicals;

providing inside said process chamber a body including a recess for receiving said substrate, said recess having a nadir surface and a side surface extending from said nadir surface to an opening of said recess;

positioning said substrate in said recess of said body with said entire first opposed major surface of said substrate contacting said nadir surface of said recess and with said peripheral surface spaced from said side surface of said recess;

forming a flow of said reactive radicals directed toward said substrate, avid said reactive radicals comprising atoms associated with a reactive gas, with said reactive gas being selected from a group consisting of $NF_3$, $F_2$, diluted $CF_4$, $C_2F_6$, $C_3F_8$, $SF_6$, and $ClF_3$; and maintaining said flow for a sufficient amount of time to remove film present on said peripheral surface.

12. The method as recited in claim 11 wherein said body is formed from aluminum nitride.

13. The method as recited in claim 10 wherein said process chamber is pressurized to a pressure in the range of 0.5 to 3.0 Torr, inclusive.

14. The method as recited in claim 10 wherein forming said plasma includes exciting a process gas with an RF component having a power in the range of 1 to 3 kilowatts.

15. The method as recited in claim 11 wherein said film is a dielectric film.

16. The method as recited in claim 11 wherein the flow of said reactive radicals is directed toward said second opposed major surface of said substrate.

17. The method as recited in claim 11 wherein said peripheral spice of said substrate is spaced from said side surface of said recess by a distance of 5 to 30 mils, inclusive.

18. The method as recited in claim 11 wherein the flow of said reactive radicals is oriented transversely to said first and second opposed major surfaces.

19. A method of removing film from a substrate of the type having first and second opposed major surfaces and a peripheral surface positioned therebetween, with said film being present on said first opposed major surface and said peripheral surface, with said substrate being disposed in a process chamber, said method comprising:

forming a plasma remotely with respect to said process chamber, said plasma including a plurality of reactive radicals;

forming a flow of said reactive radicals directed toward said substrate;

shielding said first opposed major surface from said flow by positioning said substrate in a recess of a body, said recess having a nadir surface, said substrate positioned in the recess such that the first opposed major surface is facing the nadir surface; and maintaining said flow for a sufficient amount of time to remove film present on said peripheral surface, wherein shielding said fist surface from said flow includes positioning said substrate in the recess such that the peripheral surface is surrounded by said body and said body is spaced apart from said peripheral surface, wherein said body is spaced apart from said peripheral surface a distance in the range of 5 to 30 mils, inclusive.

20. A method of removing film from a substrate of the type having first and second opposed major surfaces and a peripheral surface positioned therebetween, with said film being present on said first major opposed surface and said peripheral surface, with said substrate being disposed in a process chamber, said method comprising:

forming a plasma remotely with respect to said process chamber, said plasma including a plurality of reactive radicals;

forming a flow of said reactive radicals directed toward said substrate, with said reactive radicals comprising atoms associated with a reactive gas, with said reactive gas being selected from a group consisting of $NF_3$, $F_2$, diluted $CF_4$, $C_2F_6$, $C_3F_8$, $SF_6$, and $ClF_3$;

shielding said first opposed major surface from said flow by positioning said substrate in a recess of a body, said recess having a nadir surface, said substrate positioned in the recess such that the first opposed major surface is facing the nadir surface, said peripheral surface is surrounded by said body, and said body is spaced apart from said peripheral surface; and maintaining said flow for a sufficient amount of time to remove film present on said peripheral surface, wherein said body is spaced apart from said peripheral surface a distance in the range of 5 to 30 mils, inclusive.

* * * * *